United States Patent
Schaller et al.

(10) Patent No.: US 11,835,600 B2
(45) Date of Patent: Dec. 5, 2023

(54) CURRENT SENSOR

(71) Applicant: Infineon Technologies AG, Neubiberg (DE)

(72) Inventors: Rainer Markus Schaller, Saal a.d. Donau (DE); Volker Strutz, Tegernheim (DE); Jochen Dangelmaier, Beratzhausen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 17/807,002

(22) Filed: Jun. 15, 2022

(65) Prior Publication Data
US 2022/0404440 A1   Dec. 22, 2022

(30) Foreign Application Priority Data
Jun. 16, 2021 (DE) .......................... 102021115598.3

(51) Int. Cl.
| | |
|---|---|
| G01R 33/07 | (2006.01) |
| G01R 15/20 | (2006.01) |
| G01R 33/09 | (2006.01) |

(52) U.S. Cl.
CPC ........... *G01R 33/07* (2013.01); *G01R 15/202* (2013.01); *G01R 15/205* (2013.01); *G01R 33/09* (2013.01)

(58) Field of Classification Search
CPC .... G01R 33/07; G01R 15/202; G01R 15/205; G01R 33/09; G01R 33/091; G01R 33/0047; G01R 33/072
See application file for complete search history.

(56) References Cited

U.S. PATENT DOCUMENTS

| | | | |
|---|---|---|---|
| 6,356,068 B1 | 3/2002 | Steiner et al. | |
| 7,166,807 B2 | 1/2007 | Gagnon et al. | |
| 2004/0155644 A1* | 8/2004 | Stauth | G01R 15/207 |
| | | | 324/117 R |
| 2011/0222225 A1* | 9/2011 | Kessler | G06F 3/05 |
| | | | 361/679.02 |
| 2014/0253103 A1 | 9/2014 | Racz et al. | |
| 2017/0138988 A1* | 5/2017 | Ausserlechner | H01L 24/34 |
| 2018/0149677 A1* | 5/2018 | Milano | G01R 15/148 |
| 2018/0180649 A1* | 6/2018 | Paci | G01R 15/205 |

FOREIGN PATENT DOCUMENTS

DE   112012003079 T5   6/2014

* cited by examiner

*Primary Examiner* — Alvaro E Fortich
(74) *Attorney, Agent, or Firm* — Harrity & Harrity, LLP

(57) ABSTRACT

What is proposed is a current sensor comprising a current rail and comprising a magnetic field sensor, wherein the magnetic field sensor is configured to measure a magnetic field induced by a current flowing through the current rail, wherein a first insulation layer and a second insulation layer are arranged between the current rail and the magnetic field sensor, wherein an interface between the first insulation layer and the second insulation layer is free of a contact with the current rail and/or is free of a contact with the magnetic field sensor.

20 Claims, 9 Drawing Sheets

CURRENT SENSOR

CROSS REFERENCE TO RELATED APPLICATION

This application claims priority to German Patent Application No. 102021115598.3 filed on Jun. 16, 2021, the content of which is incorporated by reference herein in its entirety.

TECHNICAL FIELD

The present implementation relates to a current sensor.

BACKGROUND

U.S. Pat. No. 8,907,437 B2 discloses a current sensor which is accommodated in a housing with an integrated circuit and contains a circuit for detecting the magnetic field, a current conductor and an insulator. The insulator is provided as an insulation structure having at least two layers composed of thin sheet material. The insulation structure is dimensioned such that the plastic material forming a molded plastic body of the package affords a reinforced insulation. In accordance with one implementation, the insulation structure has two layers of insulating tape. Each insulating tape layer contains a polyimide film and an adhesive. The insulation structure and the molded plastic body can be constructed so as to achieve at least an operating voltage of 500 VRMS.

A further current sensor with an integrated circuit is described in U.S. Pat. No. 7,709,754 B2. The known current sensor comprises a leadframe having at least two leads coupled in such a way that they form a current conductor section, and a substrate having a first surface, in which one or more magnetic field sensors are arranged, the first surface being situated in the vicinity of the current conductor section and a second surface being situated at a distance from the current conductor section. In examples, the substrate is arranged in such a way that the first surface of the substrate lies above the current conductor section and the second surface of the substrate lies above the first surface. In other words, the substrate is arranged upside down in the integrated circuit relative to a conventional orientation. As a result, the magnetic field sensor(s) can lie very close to the current conductor section, which results in a current sensor having improved sensitivity.

There is a need for a current sensor which ensures an even more reliable galvanic isolation of a magnetic field sensor for measuring the current flowing through a current rail and the current rail.

SUMMARY

A current sensor as claimed in the main claim is proposed. Further configurations are presented in the dependent claims.

What is proposed is a current sensor comprising a current rail and comprising a magnetic field sensor, wherein the magnetic field sensor is configured to measure a magnetic field induced by a current flowing through the current rail, wherein a first insulation layer and a second insulation layer are arranged between the current rail and the magnetic field sensor, wherein an interface between the first insulation layer and the second insulation layer is free of a contact with the current rail and/or is free of a contact with the magnetic field sensor.

BRIEF DESCRIPTION OF THE DRAWINGS

Various configurations of the proposed current sensor will now be explained in greater detail with reference to the drawing, in which.

DETAILED DESCRIPTION

Figure 1:
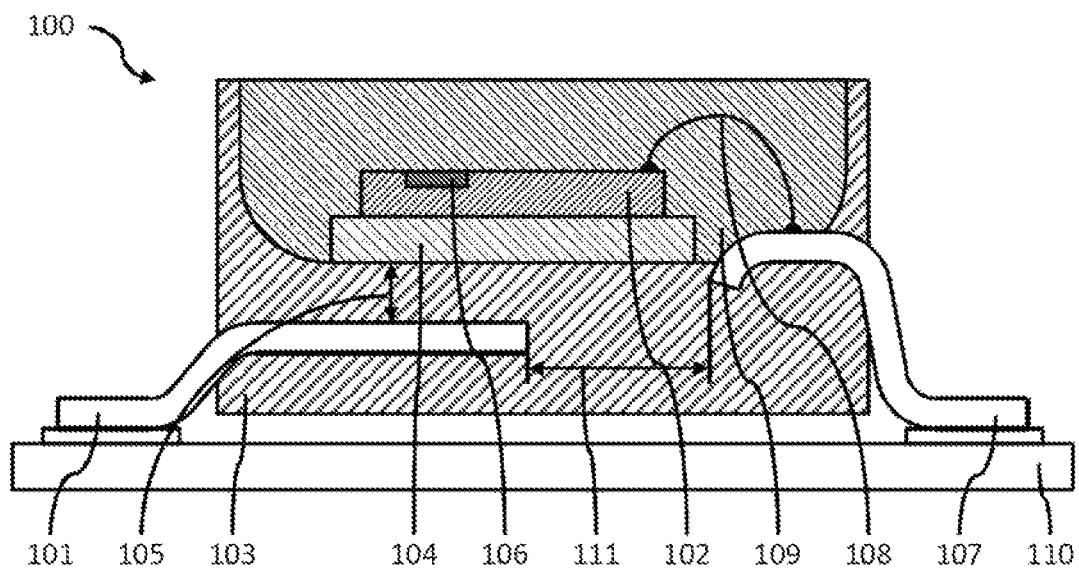
FIG. 1 shows a current sensor.

FIG. 1 shows a current sensor 100. The current sensor 100 comprises a current rail 101 and a magnetic field sensor 102. The magnetic field sensor 102 is configured to measure a magnetic field induced by a current flowing through the current rail 101. In this case, the magnetic field is dependent on the current flowing through the current rail 101, such that a measurement value measured using the magnetic field sensor 102 is indicative of the current flowing through the current rail 101.

Current sensors may be utilized to measure the charging current of batteries of electrically driven motor vehicles that are increasingly replacing vehicles having internal combustion engines. Current sensors may be utilized to measure the current flowing from the battery to the electric motors of the drive. More and more often, electrical networks in motor vehicles are being operated with voltages which are a multiple of the voltage with which magnetic field sensors are operated. A very reliable and permanent galvanic isolation between the current rail 101 and the magnetic field sensor 102 is therefore desired.

A first insulation layer 103 and a second insulation layer 104 are arranged between the current rail 101 and the magnetic field sensor 102. In this case, in the case of the current sensor shown in FIG. 1, the interface between the first insulation layer 103 and the second insulation layer 104 is free of a contact with the current rail 101 and free of a contact with the magnetic field sensor 102.

The first insulation layer 103 and the second insulation layer 104 can be configured such that, independently of one another, they can provide for a sufficient galvanic isolation between the current rail 101 and the magnetic field sensor. Even if the function of one of the two insulation layers 103, 104 is impaired, the other insulation layer 104, 103 can still always prevent a current from flowing between the current rail 101 and the magnetic field sensor 102.

By virtue of the first insulation layer 103 and the second insulation layer 104 being arranged such that the interface between the first insulation layer 103 and the second insulation layer 104 is free of a contact with the current rail 101 and/or free of a contact with the magnetic field sensor 102, the risk of a current path from the current rail 101 to the magnetic field sensor 102 forming along the interface can be reduced.

The interface between the first insulation layer 103 and the second insulation layer can be free of a section which is parallel to a direction from a conductive section of the magnetic field sensor 102 to a conductive section of the current rail 101. In this way, even in the case of a potential difference between the conductive section of the magnetic field sensor 102 and the conductive section of the current rail 101, the probability of a current flow along the interface can be reduced.

The interface between the first insulation layer 103 and the second insulation layer 104 can be oriented for example substantially perpendicular to a direction from a conductive section of the magnetic field sensor 102 to a conductive section of the current rail 101.

A thickness 105 of the first insulation layer 105 and/or a thickness of the second insulation layer 104 in a direction from a conductive section of the magnetic field sensor to a conductive section of the current rail can be in particular more than 10 micrometers (µm), in particular more than 100 µm, in order to enable a reliable galvanic isolation.

A thickness 105 of the first insulation layer 103 and/or of the second insulation layer 104 can be less than 1000 µm. In some implementations, the thickness 105 of the first insulation layer 103 and/or of the second insulation layer 104 can be less than 200 µm. The sensitivity of the current sensor 100 may be dependent on the distance between the magnetic field sensor 102 and the current rail 101. A limitation of the thickness of the first insulation layer 103 and/or of the second insulation layer 104 can therefore increase the accuracy of the current sensor 100.

In the case of the current sensor 100 shown in FIG. 1, the first insulation layer 103 is fabricated from a first material and the second insulation layer 104 is fabricated from a second material, wherein the first material is different than the second material. The use of different materials can reduce the risk that, on account of a material defect, both insulation layers at the same time will no longer be able to ensure a sufficient galvanic isolation.

The first material and/or the second material can have a dielectric constant having a value of between 2 and 12.

The first material and/or the second material can have a dielectric strength value of more than 10 volts per micrometer (V/µm). In some implementations, the first material and/or the second material can have a dielectric strength value of more than 30 V/µm. This can allow the current sensor to be utilized for high-voltage direct current applications as well.

Furthermore, the first material and/or the second material can have an insulation resistance value of more than $10^{10}$ ohm-centimeters (Ωcm), in particular more than $10^{17}$ Ωcm, such that creepage currents can be effectively prevented.

The interface between the first insulation layer and the second insulation layer can have a continuous course, in particular a continuously differentiable course. An interface without edges or corners can help here to avoid local electrostatic voltage spikes and to further increase the durability of the current sensor.

The second insulation layer 104 can be an adhesive layer used to secure the magnetic field sensor 102 to the first insulation layer 103.

The second insulation layer can be part of an encapsulation of the current sensor.

The magnetic field sensor can comprise an integrated circuit, wherein the integrated circuit has a substrate side and a component side, and wherein a magnetic field sensor element 105 is arranged at the component side.

In the case of the current sensor 100 in accordance with FIG. 1, the substrate side of the magnetic field sensor 102 faces the current rail 101. This can reduce the risk of damage to the magnetic field sensor element 106 during the mechanical securing of the magnetic field sensor 102. It is likewise conceivable for the arrangement of the magnetic field sensor 102 with the substrate side toward the current rail 101 to simplify an electrical connection from a contact pad of the magnetic field sensor 102 to an electrical connecting terminal 107, e.g., a leadframe, of the current sensor 100 using a wire 108 (e.g. via wire bonding).

The magnetic field sensor 102 can be arranged in a prefabricated trough 109. This can simplify the production of the current sensor. By way of example, the trough 109 can be embodied in a prefabricated housing of the current sensor. In some implementations, the current rail 101 can be embodied in a prefabricated housing of the current sensor 100.

The magnetic field sensor 102 can comprise in particular a Hall sensor element. Alternatively or supplementarily, the magnetic field sensor 102 can comprise a magnetoresistive magnetic field sensor element.

As shown in FIG. 1, the current rail 101 can be embedded in the prefabricated housing of the current sensor 100.

The current sensor 100 can be configured to be mounted on a printed circuit board (PCB) 110. In this way it can be integrated into electrical circuits in a simple manner.

The distance 111 between the electrical connecting terminal 107 and the current rail 101 can be more than 300 µm, in some implementations more than 400 µm, in order to prevent the measurement signals from being electrically influenced by the current conducted by the current line.

Figure 2:
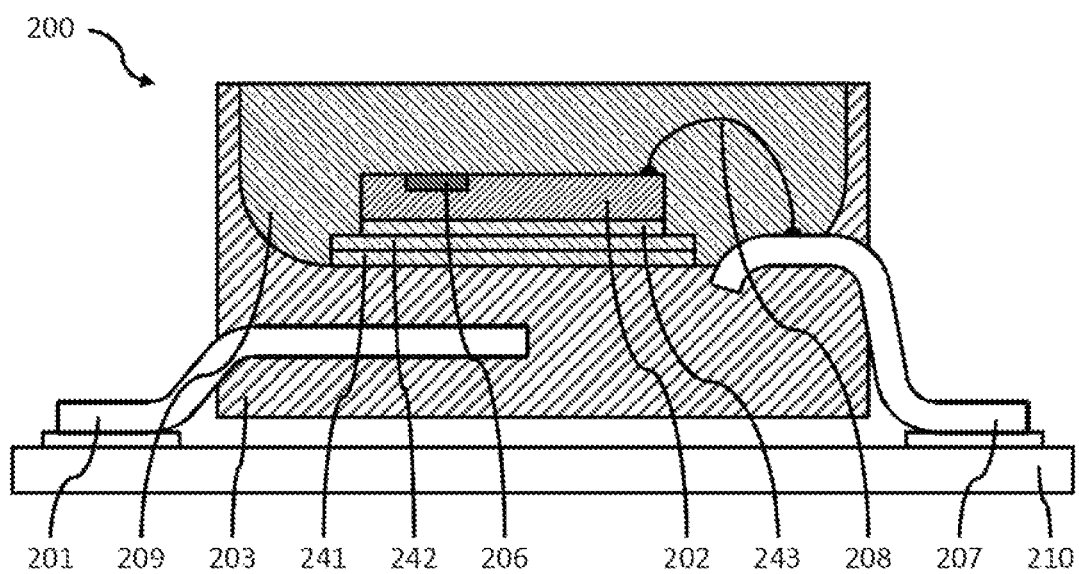
FIG. 2 shows a current sensor.

FIG. 2 illustrates a further current sensor 200. The current sensor 200 likewise comprises a current rail 201 and a magnetic field sensor 202. A first insulation layer 203 and a second insulation layer are arranged between the current rail 201 and the magnetic field sensor 202. The interface between the first insulation layer 203 and the second insulation layer is free of a contact with the current rail 201 and free of a contact with the magnetic field sensor 202. The second insulation layer comprises a first adhesive layer 241, a dielectric layer 242 and a second adhesive layer 243. In the case of some current sensors, the second adhesive layer 243 can also be dispensed with and the dielectric layer 242 can be directly connected to the magnetic field sensor 202.

The dielectric layer 242 can be produced from polyimide. The dielectric layer 242 can have a thickness of more than 5 µm and/or less than 15 µm. In some implementations, the dielectric layer 242 can have a thickness of approximately 10 µm. The thickness of the first adhesive layer 241 and/or of the second adhesive layer 243 can be less than 10 µm, in some implementations less than 5 µm. The first adhesive layer 241 and/or the second adhesive layer 243 can be antistatic adhesive layers. In the case of the current sensor 200, the second adhesive layer can be a DDAF (Dicing Die Attach Film) adhesive layer.

In order to produce the current sensor 200, for example, it is possible to provide a trough 209 in a prefabricated housing, wherein the current rail 201 and an electrical connecting terminal 207 for the magnetic field sensor 202 are integrated into the prefabricated housing. In this case, the prefabricated housing provides the first insulation layer 203. The dielectric layer 242 can subsequently be fitted into the trough 209 with the aid of the first adhesive layer 241. The magnetic field sensor 202 having a magnetic sensor element 206 can subsequently be adhesively bonded, and thus mechanically fixed, onto the dielectric layer using the second adhesive layer 243. The magnetic field sensor 202 or the magnetic field sensor element 206 is connected to the electrical connecting terminal 207 using a wire 208. The trough 209 can subsequently be filled with a potting material in order to protect the magnetic field sensor 202 and the wire connection against harmful environmental influences. The sensor 200 thus produced can then be mounted on a printed circuit board 210, for example.

Figure 3:
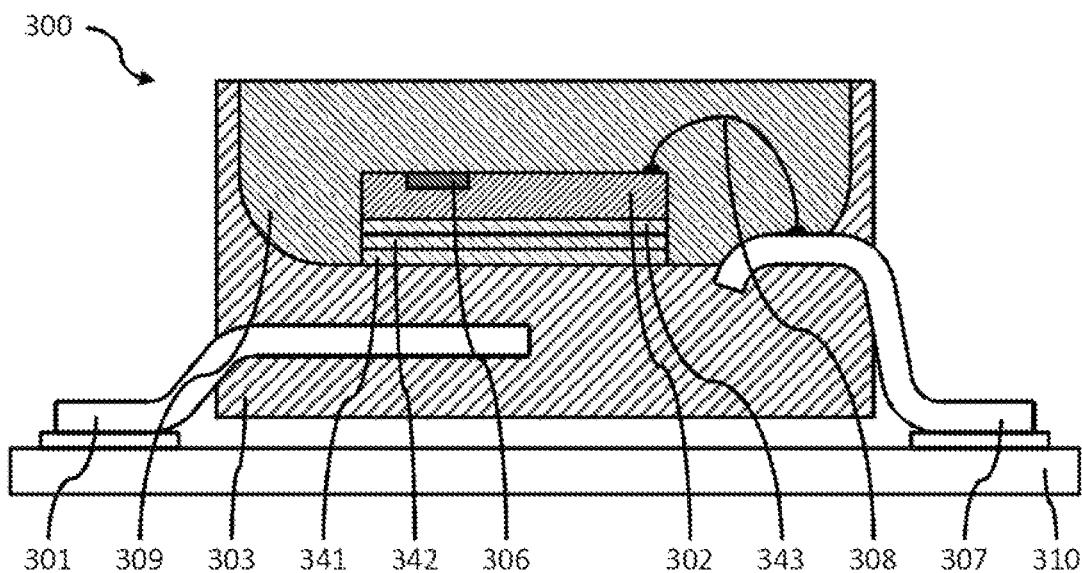
FIG. 3 shows a current sensor.

FIG. 3, too, illustrates a current sensor 300 comprising a current rail 301 and a magnetic field sensor 302. Once again, a first insulation layer 303 and a second insulation layer are arranged between the current rail 301 and the magnetic field sensor 302, wherein the second insulation layer has a first adhesive layer 341, a dielectric layer 342 and a second adhesive layer 343. The interface between the first insulation layer 303 and the second insulation layer is again free of a contact with the magnetic field sensor 302 and the current rail 301.

In order to fabricate the current sensor 300, a trough 309 may be provided in a prefabricated housing, wherein the current rail 301 and an electrical connecting terminal 307 for the magnetic field sensor 302 are encapsulated in the prefabricated housing, wherein the first insulation layer 303 is part of the encapsulation. The magnetic field sensor 302 provided with the first adhesive layer 341, the dielectric layer 342 and the second adhesive layer 343 can subsequently be fitted in the trough 309. The magnetic field sensor 302 or the magnetic field sensor element 306 is connected to the electrical connecting terminal 307 using a wire 308. The trough 309 can subsequently be filled with a potting material in order to protect the magnetic field sensor 302 and the wire connection against harmful environmental influences. The sensor 300 thus produced can then be mounted on a printed circuit board 310, for example.

Figure 4:
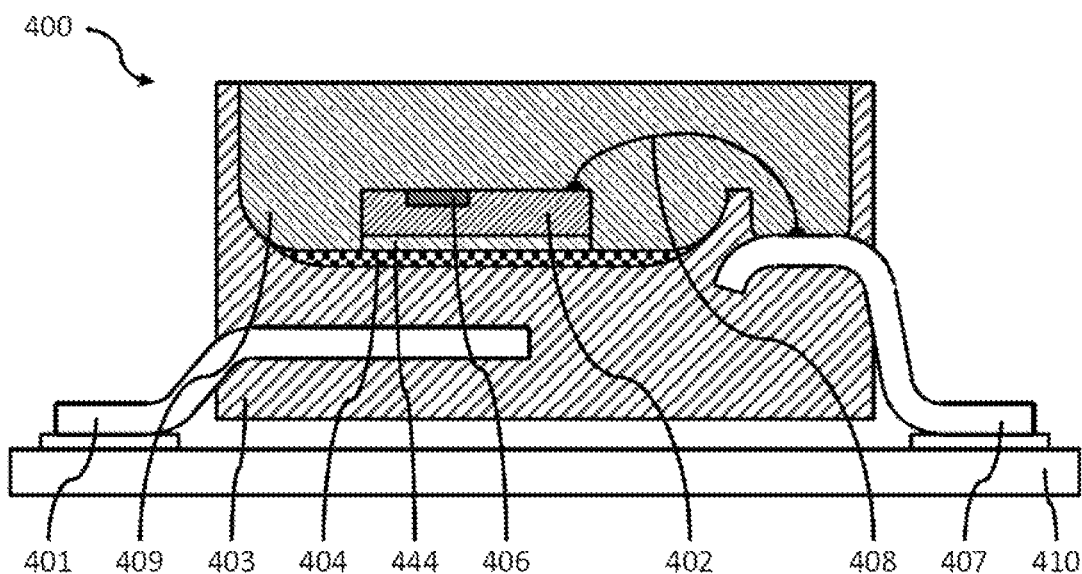
FIG. 4 shows a current sensor.

In the case of the current sensor 400 illustrated in FIG. 4, firstly a housing with a trough 409 is prefabricated, in which trough a current rail 401 and an electrical connecting terminal 407 are integrated. In this case, the first insulation layer 403 is part of the housing. A liquid material can be introduced into the trough 409, and forms a second insulation layer 404 after curing. The trough 409 can be fashioned such that the liquid material does not come into contact with the electrical connecting terminal 407. The first magnetic field sensor 402 can be adhesively bonded onto the second insulation layer 404 using an adhesive layer 444. The interface between the first insulation layer 403 and the second insulation layer 404 is free of a contact with the current rail 401 and free of a contact with the magnetic field sensor 402.

The material of the second insulation layer 404 can be an inorganic material. By way of example, the second insulation layer 404 can be fabricated from glass frit or a cement. The second insulation layer 404 can also be produced from silicone, in some implementations, a fluorinated silicone.

The adhesive layer 444 can be an antistatic adhesive layer.

After the mechanical securing of the magnetic field sensor 402, the latter or the magnetic field sensor element 406 can be connected to the electrical connecting terminal 407 using a wire 408. The current sensor 400 can subsequently be mounted on a printed circuit board 410.

Figure 5:
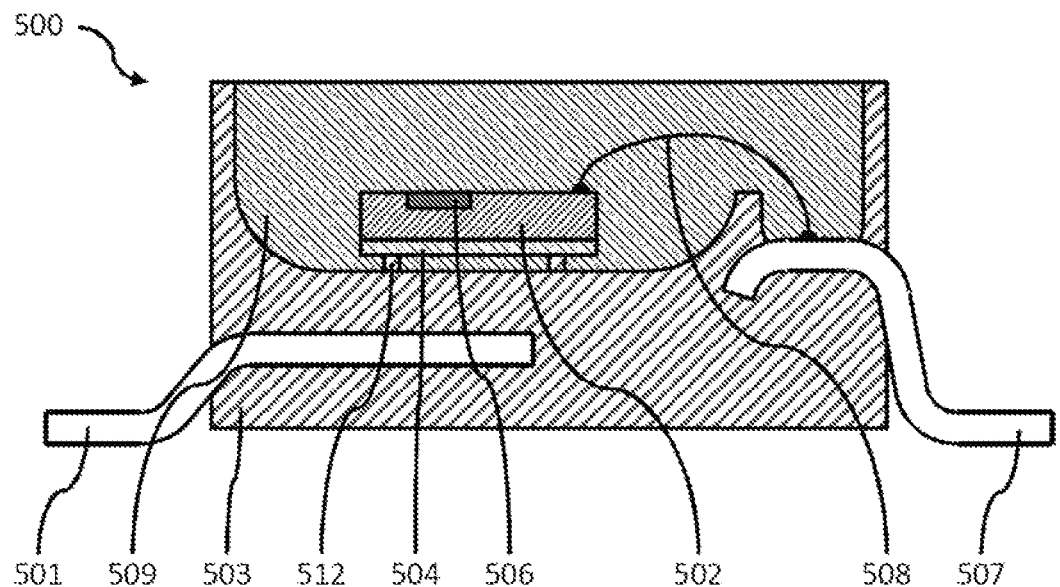
FIG. 5 shows a current sensor.

FIG. 5 likewise shows a current sensor 500 comprising a current rail 501 and a magnetic field sensor 502. A first insulation layer 503 and a second insulation layer 504 are arranged between the current rail 501 and the magnetic field sensor 502. The magnetic field sensor 502 comprises a semiconductor circuit fabricated in a semiconductor chip. The second insulation layer 504 is formed by a rear-side oxide of the semiconductor chip. The magnetic field sensor 502 can have mechanical contact with the housing only by way of a small number of elevations 512. After the magnetic field sensor 502 or the magnetic field sensor element 506 has been electrically connected to the electrical connecting terminal 507 using a wire 508, the trough 509 of the prefabricated housing can be filled with a gel. A flexible mechanical of the magnetic field sensor 502 can be made possible by the compliance of the gel, thereby reducing the risk of a fracture of the magnetic field sensor 502.

Figure 6:
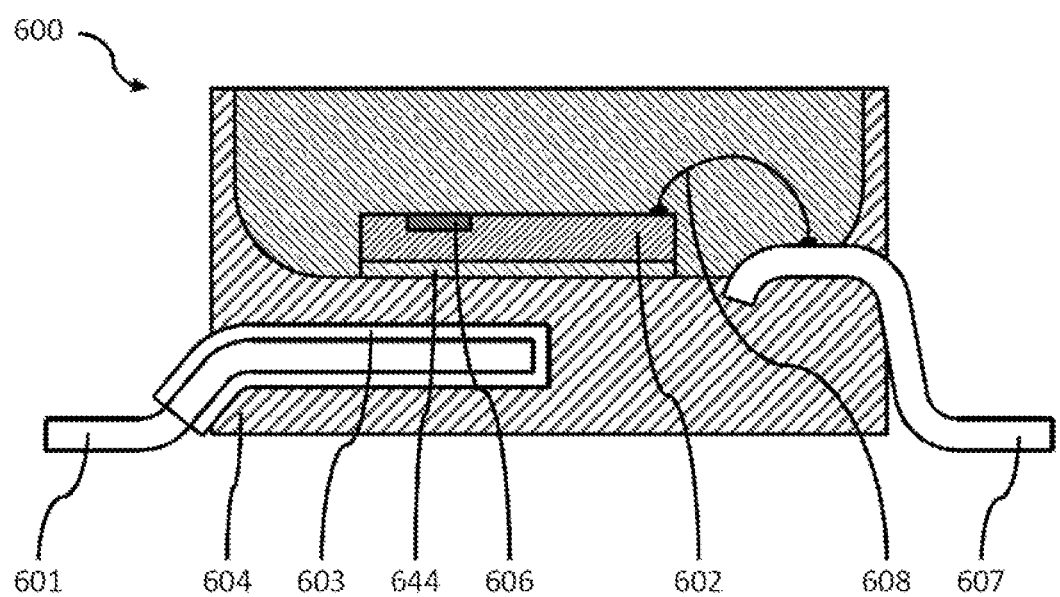
FIG. 6 shows a current sensor.

In the case of the current sensor 600 according to FIG. 6, the first insulation layer 603 is embodied as a coating of the current rail 601. The coating of the current rail 601 can be formed from a parylene and/or a metal oxide, for example. The coating of the current rail 601 can be produced using an electrophoretic deposition. A second insulation layer 604 is arranged between the magnetic field sensor 602 with the magnetic field sensor element 606, the second insulation layer being formed by the housing of the current sensor 600. In a trough of the housing, the magnetic field sensor 602 is secured using an adhesive layer 644 and is connected to an electrical connecting terminal 607 of the current sensor 600 using a wire 608.

Figure 7:
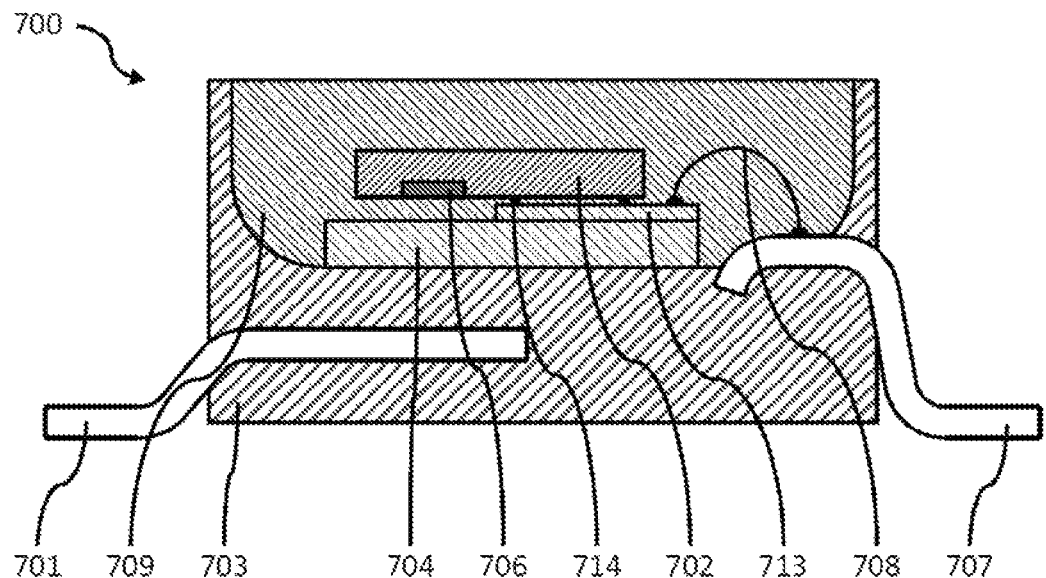
FIG. 7 shows a current sensor.

FIG. 7 shows a current sensor 700 in which the magnetic field sensor 702 comprises an integrated circuit, wherein the integrated circuit has a substrate side and a component side, and wherein a magnetic field sensor element 706 is arranged at the component side. In contrast to the current sensors shown in FIGS. 1-6, in the case of the current sensor 700, the component side faces the current rail 701 of the current sensor 700. This can allow the magnetic field sensor element 706 to be positioned closer to the current rail 701, with the result that a more sensitive current sensor 700 can be made available. Nevertheless, a first insulation layer 703 and a second insulation layer 704 are furthermore arranged between the magnetic field sensor 702 and the current rail 701.

A ball grid array (BGA) 714 can be used in order to electrically connect the magnetic field sensor 702 to an interconnect element 713. The interconnect element 713 can be realized by a metal layer on a polyimide film, the polyimide film forming the second insulation layer 704. From the interconnect element 713, a wire 708 can be used for electrical connection to the electrical connecting terminal 707 of the current sensor 700. The magnetic field sensor 702 can be arranged in the trough 709 of a prefabricated housing of the current sensor 700. By way of the electrical connecting terminal 707, the current sensor 700 can be connected to a printed circuit board (not illustrated).

Figure 8:
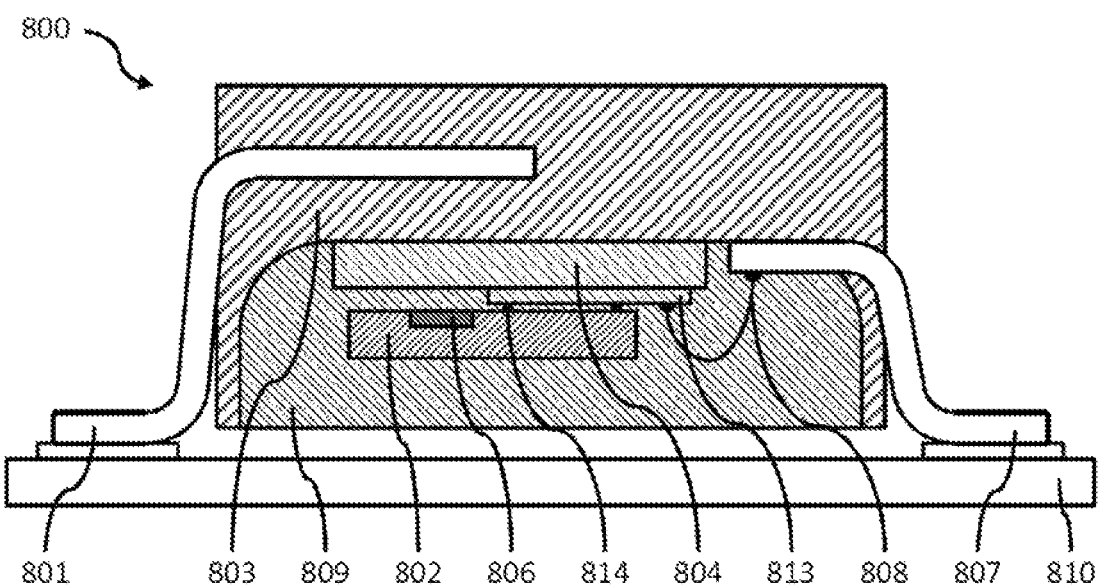
FIG. 8 shows a current sensor.

The elements 801, 802, 803, 804, 806, 807, 808, 809, 813, 814 of the current sensor 800 shown in FIG. 8 correspond to the elements 701, 702, 703, 704, 706, 707, 708, 709, 713, 714 of the current sensor 700 shown in FIG. 7.

In contrast to the current sensor 700, the trough 809 of the current sensor 800 is arranged on the side which faces the printed circuit board 810 in the state of the current sensor 800 mounted on the printed circuit board 810.

In contrast to the current sensors shown in FIGS. 1-8, a current sensor can also be produced without a prefabricated housing.

Figure 9:
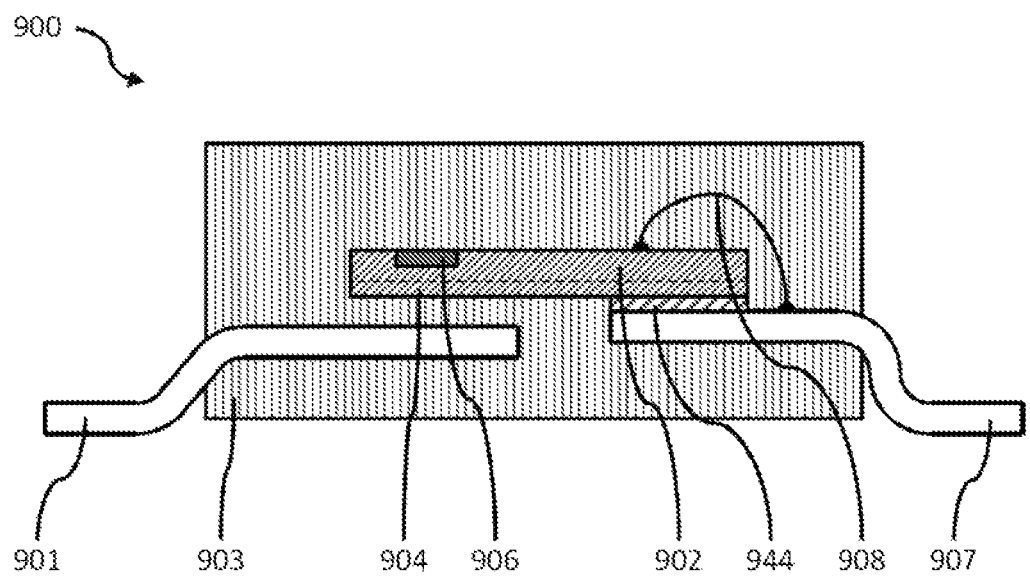
FIG. 9 shows a current sensor.

The current sensor 900 illustrated in FIG. 9 can be produced by film-assisted transfer molding, for example.

The current sensor 900 comprises a current rail 901 and a magnetic field sensor 902. A first insulation layer 903 and a second insulation layer 904 are provided between the current rail 901 and the magnetic field sensor 902. The interface between the first insulation layer 903 and the second insulation layer 904 is free of a contact with the current rail 901.

In order to produce the current sensor 900, firstly a current rail 901 and an electrical connecting terminal 907 can be provided. The current rail 901 and the electrical connecting terminal 907 can each be a section of a leadframe. The magnetic field sensor 902 can be fitted on the electrical connecting terminal 907 using an adhesive layer 944. The magnetic field sensor 902 having a magnetic field sensor element 906 can subsequently be connected to the electrical connecting terminal 907 using a wire 908. The elements of the current sensor can subsequently be potted, such that only the connecting terminals of the current rail 901 and of the electrical connecting terminal 907 are led toward the outside. In this case, the material used for potting can form the first insulation layer 903.

The magnetic field sensor 902 can be part of an integrated circuit formed in a semiconductor chip. The second insulation layer 904 can be in particular a passivation layer of the semiconductor chip. The passivation layer of the semiconductor chip can be formed in particular from silicon oxide and/or silicon nitride.

Figure 10:
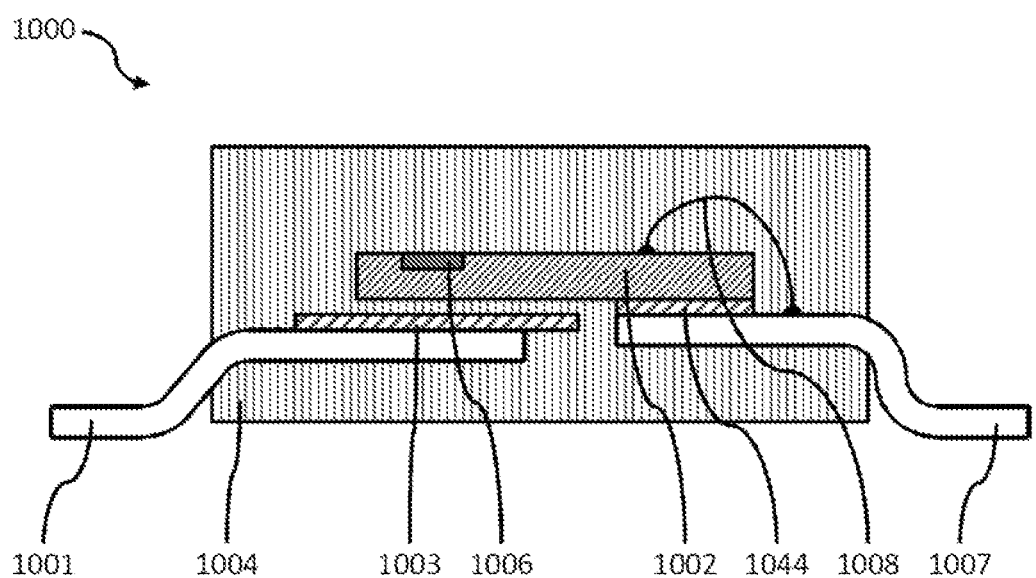
FIG. 10 shows a current sensor.

FIG. 10 illustrates a further current sensor 1000. The current sensor 1000 comprises a current rail 1001 and a magnetic field sensor 1002 having a magnetic field sensor element 1006. As in the case of the current sensor 900 shown in FIG. 9, in the case of the current sensor 1000 the magnetic field sensor 1002 is mechanically secured to an electrical connecting terminal 1007 using an adhesive layer 1044 and is electrically connected to the electrical connecting terminal using a wire 1008. However, the first insulation layer 1003 is not formed by the potting material, but rather by a film applied prior to the potting and prior to the fitting of the magnetic field sensor 1002. The second insulation layer 1004 is provided by the potting material.

Figure 11:
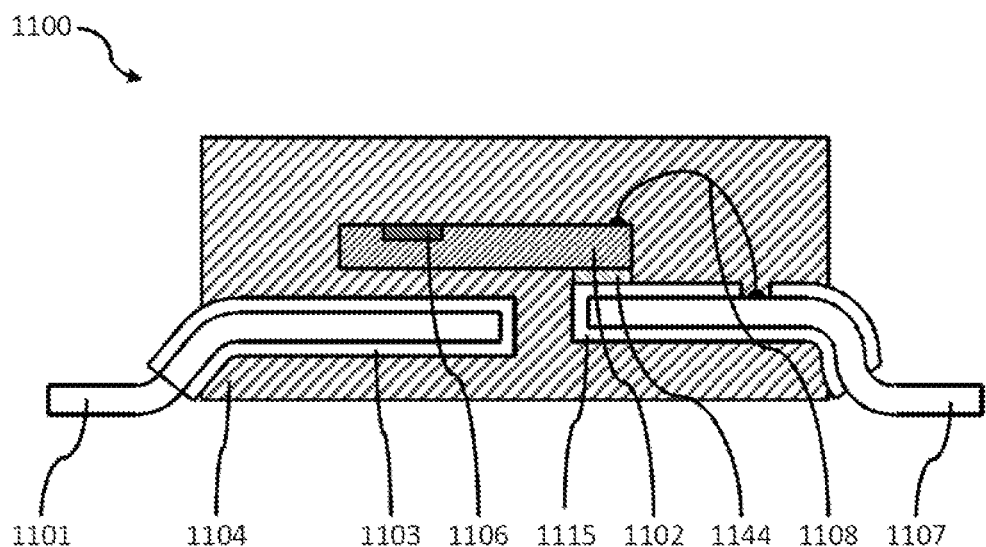
FIG. 11 shows a current sensor.

The current sensor 1100 shown in FIG. 11 also comprises a current rail 1101 and a magnetic field sensor 1102 having a magnetic field sensor element 1106. A first insulation layer 1103 is provided as a coating of the current rail 1101. The second insulation layer 1104 is provided by the potting material. The interface between the first insulation layer 1103 and the second insulation layer 1104 is both free of a contact with the current rail 1101 and free of a contact with the magnetic field sensor 1102. The magnetic field sensor 1102 is connected to an electrical connecting terminal 1107 by a wire 1108. Apart from the point of contact with the wire 1108, the electrical connecting terminal 1107 can be provided with a connecting terminal insulation layer 1115 in order to further improve the galvanic isolation of the signal lines from the current rail 1101. The connecting terminal insulation layer 1115 can be removed in particular prior to the fitting of the wire 1108. A laser, for example, can be used for this purpose. In some implementations, a connecting terminal insulation layer 1115 may not be provided at the contact point in the first place. The magnetic field sensor 1102 can be mechanically secured to the coated electrical connecting terminal 1107 using an adhesive layer 1144.

Figure 12:
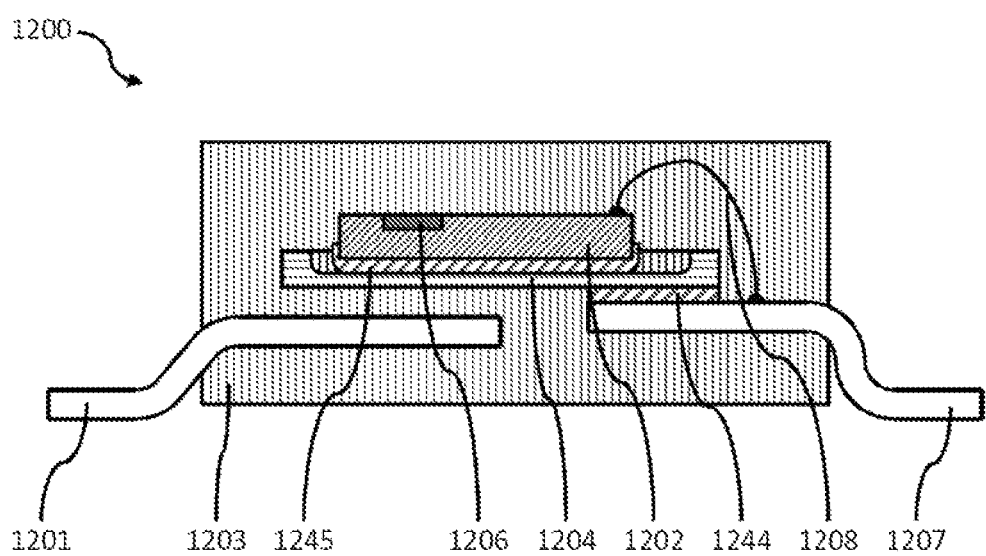
FIG. 12 shows a current sensor.

FIG. 12 likewise illustrates a current sensor 1200. The current sensor 1200 comprises a current rail 1201 and a magnetic field sensor 1202 having a magnetic field sensor element 1206. A first insulation layer 1203 is provided by the potting material. A second insulation layer 1204 is provided by a prefabricated lamella, on which the magnetic field sensor 1202 is secured using an adhesive material 1245. The magnetic field sensor 1202 can be arranged in particular in a depression of the lamella 1204. The lamella 1204 can be mechanically secured to the electrical connecting terminal 1207 by an adhesive layer 1244. It is possible first to secure the magnetic field sensor 1202 to the lamella 1204 and then to secure the lamella 1204 to the electrical connecting terminal 1207. By way of example, mechanical gripping of the lamella 1204 can be simpler than gripping of the magnetic field sensor 1202. However, it is also conceivable firstly to secure the lamella 1204 to the electrical connecting terminal 1207 and only afterward to secure the magnetic field sensor to the lamella 1204. Afterward it is possible to establish the electrical connection using the wire 1208.

Figure 13:
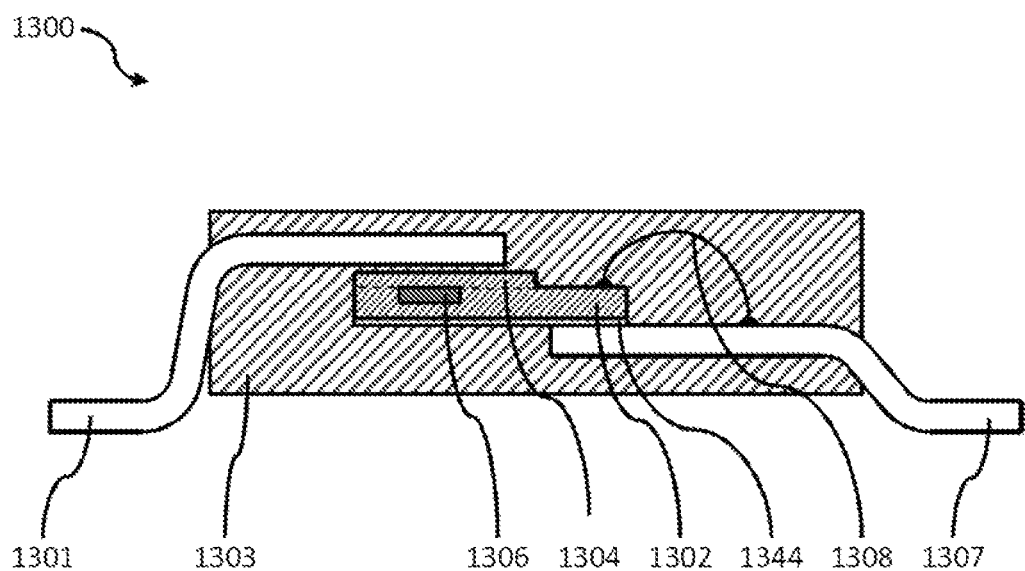
FIG. 13 shows a current sensor.

The current sensor 1300 shown in FIG. 13 comprises a current rail 1301 and a magnetic field sensor 1302 having a magnetic field sensor element 1306. A first insulation layer 1303 is formed by the potting material of the current sensor 1300. The magnetic field sensor 1302 comprises an integrated circuit, wherein the integrated circuit has a substrate side and a component side, and wherein the magnetic field sensor element 1306 is arranged at the component side. The magnetic field sensor element 1306 is covered with a passivation layer serving as second insulation layer 1304. The component side faces the current rail 1301.

The magnetic field sensor 1302 is arranged between the current rail 1301 and an electrical connecting terminal 1307. It can be secured to the electrical connecting terminal 1307 using an adhesive film 1344. Part of the component side of the integrated circuit is not covered by the passivation layer, such that the magnetic field sensor 1302 can be electrically connected to the electrical connecting terminal 1307 by a wire 1308.

Figure 14:
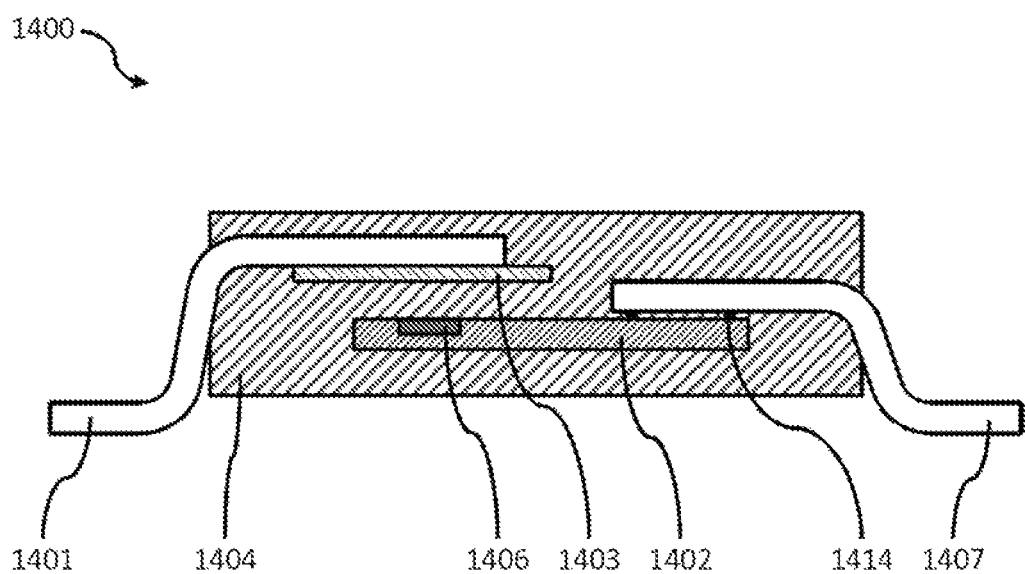
FIG. 14 shows a current sensor.

FIG. 14 illustrates a further current sensor 1400. A first insulation layer 1403 is formed by a film applied to a current rail 1401 and the potting material of the current sensor 1400 forms the second insulation layer 1404. The magnetic field sensor 1402 is arranged with its component side, at which the magnetic field sensor element 1406 is provided, toward the current rail. The magnetic field sensor 1402 is mechanically and electrically secured to the electrical connecting terminal 1407 using a ball grid array 1414.

Figure 15:
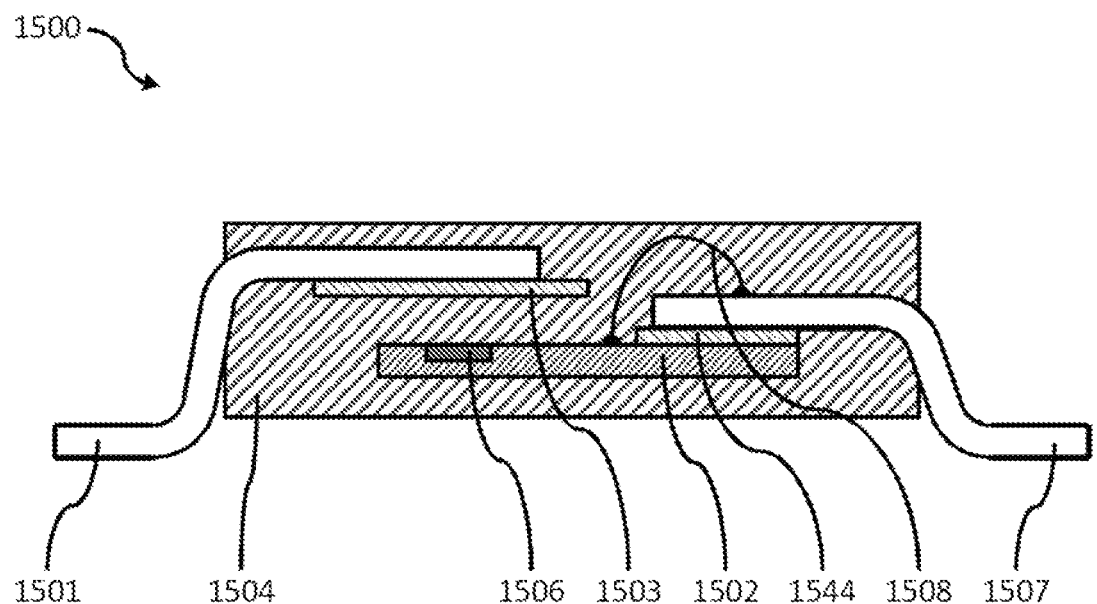
FIG. 15 shows a current sensor.

Furthermore, FIG. 15 illustrates a current sensor 1500, the elements 1501, 1504, 1506, 1503, 1502, 1507 of which correspond to the elements 1401, 1404, 1406, 1403, 1402, 1407 of the current sensor 1400 from FIG. 14. However, the magnetic field sensor 1502 is mechanically connected to the electrical connecting terminal 1507 by an adhesive layer 1544 and is electrically connected to the electrical connecting terminal via the wire 1508.

Figure 16:
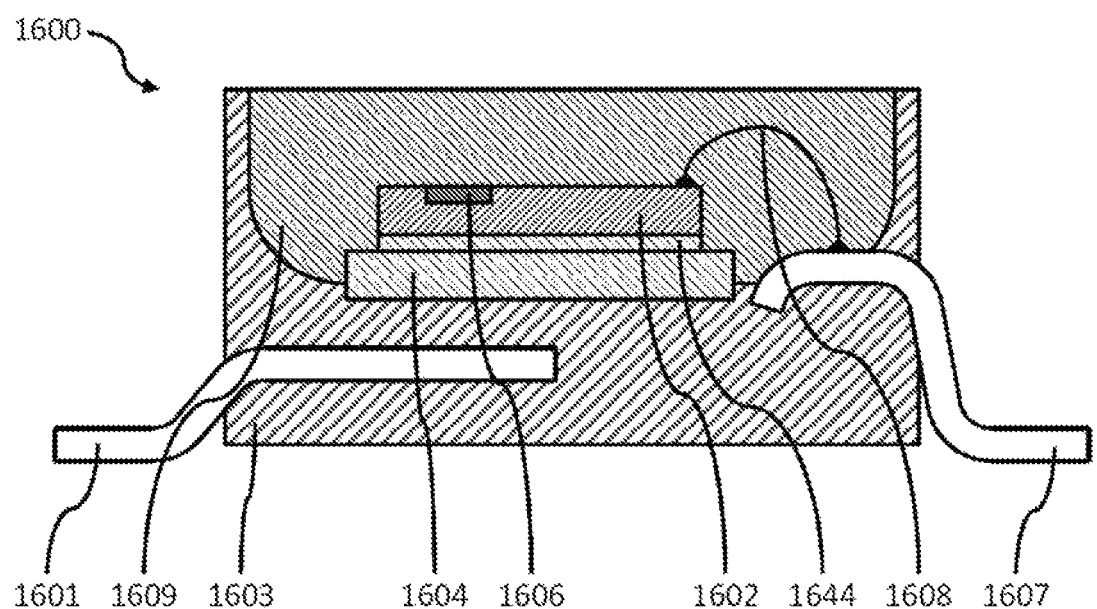
FIG. 16 shows a current sensor.

FIG. 16 shows a further current sensor 1600, the elements 1601, 1609, 1603, 1606, 1602, 1608, 1607 of which correspond to the elements 201, 209, 203, 206, 202, 208, 207 of the current sensor 200 shown in FIG. 2. The magnetic field sensor 1602 is connected to a lamella 1604, e.g., a glass lamella, using an adhesive layer 1644, the lamella 1604 providing the second insulation layer. The lamella 1604 can be heated and then be introduced into the trough 1609 of the prefabricated housing in the heated state in order to mechanically connect it to the prefabricated housing.

Figure 17:
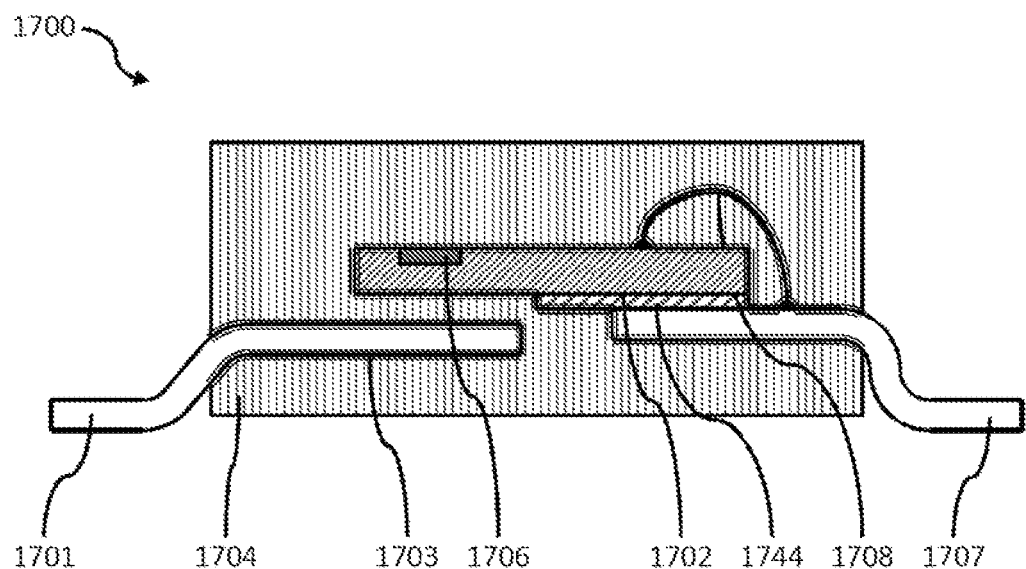
FIG. 17 shows a current sensor.
Figure 18:
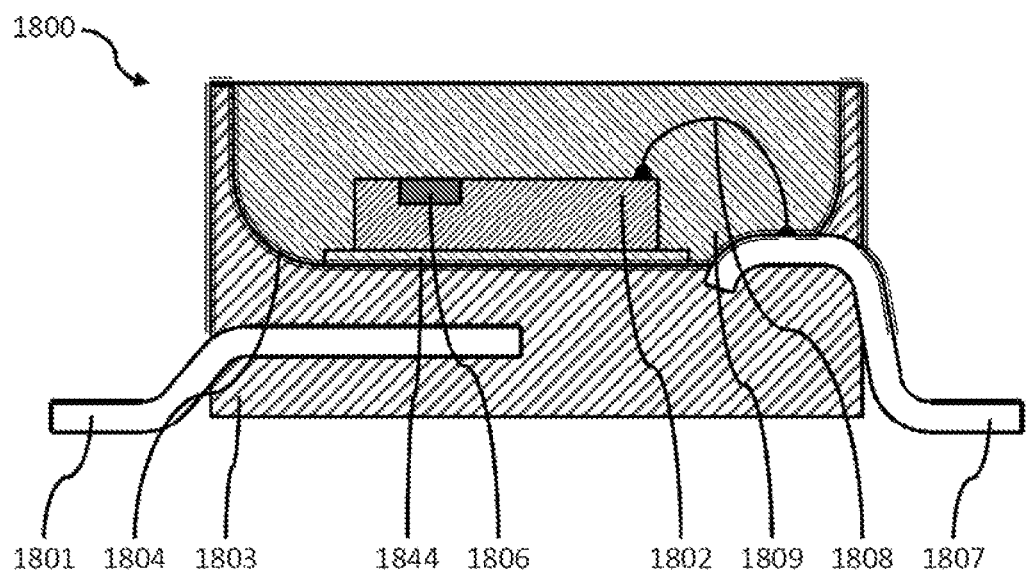
FIG. 18 shows a current sensor.

FIGS. 17 and 18 illustrate two further current sensors 1700 and 1800, respectively comprising a current rail 1701, 1801, a magnetic field sensor 1702, 1802, a magnetic field sensor element 1706, 1806, an electrical connecting terminal 1707, 1807 and a wire 1708, 1808 connecting the magnetic field sensor 1702, 1802 to the electrical connecting terminal 1707 and 1807, respectively.

The magnetic field sensor 1702 of the current sensor 1700 is connected to the electrical connecting terminal using an adhesive layer 1744. A conformal layer is deposited prior to the potting of the magnetic field sensor 1702, and forms the first insulation layer 1703 between the current rail 1701 and the magnetic field sensor 1702. The second insulation layer 1704 can be formed by the encapsulation.

The current sensor 1800 comprises a prefabricated housing having a trough 1809. The material of the prefabricated housing forms the first insulation layer 1803. A layer serving as second insulation layer 1804 can be deposited conformally on the prefabricated housing. Afterward, the magnetic field sensor 1802 can be fitted in the trough 1809 and the electrical connection to the electrical connecting terminal 1807 can be established.

In summary, many examples of current sensors are shown which are distinguished by a particularly good reliability by virtue of the provision of a first and a second insulation layer.

ASPECTS

Some example implementations are defined by the following Aspects:

Aspect 1. A current sensor (100) comprising a current rail (101) and comprising a magnetic field sensor (102), wherein the magnetic field sensor (102) is configured to measure a magnetic field induced by a current flowing through the current rail (101), wherein a first insulation layer (103) and a second insulation layer (104) are arranged between the current rail (101) and the magnetic field sensor (102), wherein an interface between the first insulation layer (103) and the second insulation layer (104) is free of a contact with the current rail (101) and/or is free of a contact with the magnetic field sensor (102).

Aspect 2. The current sensor (100) according to aspect 1, wherein the interface is free of a section which is parallel to a direction from a conductive section of the magnetic field sensor (102) to a conductive section of the current rail (101).

Aspect 3. The current sensor (100) according to aspect 1 or 2, wherein the interface is oriented substantially perpendicular to a direction from a conductive section of the magnetic field sensor (102) to a conductive section of the current rail (101).

Aspect 4. The current sensor (100) according to any of aspects 1-3, wherein a thickness of the first insulation layer (103) and/or a thickness of the second insulation layer (104) in a direction from a conductive section of the magnetic field sensor (102) to a conductive section of the current rail (101) are/is more than 10 µm, in particular more than 100 µm and/or less than 1000 µm, in particular less than 200 µm.

Aspect 5. The current sensor (100) according to any of aspects 1-4, wherein the first insulation layer (103) is fabricated from a first material, wherein the second insulation layer (104) is fabricated from a second material, and wherein the first material is different than the second material.

Aspect 6. The current sensor (100) according to any of aspects 1-5, wherein the first material and/or the second material have/has a dielectric constant having a value of between 2 and 12.

Aspect 7. The current sensor (100) according to any of aspects 1-6, wherein the first material and/or the second material have/has a dielectric strength value of more than 10 V/µm, in some implementations, more than 30 V/µm.

Aspect 8. The current sensor (100) according to any of aspects 1-7, wherein the first material and/or the second material have/has an insulation resistance value of more than $10^{10}$ Ωcm, in some implementations, more than $10^{17}$ Ωcm.

Aspect 9. The current sensor (100) according to any of aspects 1-8, wherein the interface has a continuous course.

Aspect 10. The current sensor (100) according to any of aspects 1-9, wherein the first insulation layer (103) and/or the second insulation layer (104) comprise(s) an adhesive layer, and wherein the adhesive layer is arranged at the interface.

Aspect 11. The current sensor (900, 1000) according to any of aspects 1-10, wherein the first insulation layer (903) or the second insulation layer (1004) is part of an encapsulation of the current sensor (900, 1000).

Aspect 12. The current sensor (100, 700) according to any of aspects 1-11, wherein the magnetic field sensor (102, 702) comprises an integrated circuit, wherein the integrated circuit has a substrate side and a component side, and wherein a magnetic field sensor element (106, 706) is arranged at the component side.

Aspect 13. The current sensor (100) according to aspect 12, wherein the substrate side faces the current rail (101).

Aspect 14. The current sensor (700) according to aspect 13, wherein the component side faces the current rail (701).

Aspect 15. The current sensor (100) according to any of aspects 1-14, wherein the magnetic field sensor (102) is arranged within a prefabricated trough (109).

Aspect 16. The current sensor (100) according to aspect 15, wherein the trough (109) is embodied in a prefabricated housing of the current sensor (100).

Aspect 17. The current sensor (1100) according to any of aspects 1-16, wherein the current rail (1101) is embodied as a leadframe, and wherein the first insulation layer (1103) and/or the second insulation layer are/is a coating of the leadframe.

Aspect 18. The current sensor (100) according to any of aspects 1-17, wherein the magnetic field sensor (102) comprises a Hall sensor element.

Aspect 19. The current sensor (100) according to any of aspects 1-18, wherein the magnetic field sensor (102) comprises a magnetoresistive magnetic field sensor element.

Aspect 20. The current sensor (100) according to any of aspects 1-19, wherein the current rail (101) is embedded in a or the prefabricated housing of the current sensor.

Although specific example implementations have been illustrated and described in this description, persons who have customary knowledge in the art will recognize that a large number of alternative and/or equivalent implementations can be chosen as substitution for the specific example implementations shown and described in this description, without departing from the scope of the implementation disclosed. The intention is for this application to cover all adaptations or variations of the specific example implementations discussed here. Therefore, the intention is for this implementation to be restricted only by the claims and the equivalents of the claims.

What is claimed is:

1. A current sensor comprising:
   a current rail;
   a magnetic field sensor configured to measure a magnetic field induced by a current flowing through the current rail;
   a first insulation layer arranged between the current rail and the magnetic field sensor; and
   a second insulation layer arranged between the current rail and the magnetic field sensor,
   wherein the second insulation layer is arranged in direct contact with the first insulation layer at an interface such that the first insulation layer is arranged between the current rail and the second insulation layer and the second insulation layer is arranged between the magnetic field sensor and the first insulation layer,
wherein a portion of the current rail extends into the first insulation layer and the portion of the current rail is encapsulated by the first insulation layer,
wherein the interface between the first insulation layer and the second insulation layer is one or more of:
free of a contact with the current rail such that the interface is galvanically isolated from the current rail, or
free of a contact with the magnetic field sensor such that the interface is galvanically isolated from the magnetic field sensor.

2. The current sensor as claimed in claim 1,
wherein the interface is free of a section which is parallel to a direction from a conductive section of the magnetic field sensor to a conductive section of the current rail.

3. The current sensor as claimed in claim 1,
wherein the interface is oriented substantially perpendicular to a direction from a conductive section of the magnetic field sensor to a conductive section of the current rail.

4. The current sensor as claimed in claim 1,
wherein one or more of:
a thickness of the first insulation layer, or
a thickness of the second insulation layer,
in a direction from a conductive section of the magnetic field sensor to a conductive section of the current rail is more than 10 micrometers ($\mu$m) and less than 1000 $\mu$m.

5. The current sensor as claimed in claim 1,
wherein the first insulation layer is fabricated from a first material,
wherein the second insulation layer is fabricated from a second material, and
wherein the first material is different than the second material.

6. The current sensor as claimed in claim 5,
wherein one or more of the first material or the second material has a dielectric constant having a value of between 2 and 12.

7. The current sensor as claimed in claim 6,
wherein one or more of the first material or the second material has a dielectric strength value of more than 10 volts per micrometer (V/$\mu$m).

8. The current sensor as claimed in claim 7,
wherein one or more of the first material or the second material has an insulation resistance value of more than $10^{10}$ ohm-centimeters ($\Omega$cm).

9. The current sensor as claimed in claim 1,
wherein the interface has a continuous course, without edges or corners.

10. The current sensor as claimed in claim 1,
wherein one or more of the first insulation layer or the second insulation layer comprises an adhesive layer, and wherein the adhesive layer is arranged at the interface.

11. The current sensor as claimed in claim 1,
wherein the first insulation layer or the second insulation layer is part of an encapsulation of the current sensor.

12. The current sensor as claimed in claim 1,
wherein the magnetic field sensor comprises an integrated circuit, wherein the integrated circuit has a substrate side and a component side, and wherein a magnetic field sensor element is arranged at the component side.

13. The current sensor as claimed in claim 12,
wherein the substrate side faces the current rail.

14. The current sensor as claimed in claim 13,
wherein the component side faces the current rail.

15. The current sensor as claimed in claim 1,
wherein the magnetic field sensor is arranged within a prefabricated trough.

16. The current sensor as claimed in claim 15,
wherein the prefabricated trough is embodied in a prefabricated housing of the current sensor.

17. The current sensor as claimed in claim 1,
wherein the current rail is embodied as a leadframe, and
wherein one or more of the first insulation layer or the second insulation layer comprises a coating of the leadframe.

18. The current sensor as claimed in claim 1,
wherein the current rail is embedded in a prefabricated housing of the current sensor that is formed by the first insulation layer.

19. The current sensor as claimed in claim 1, further comprising:
an electrical connecting terminal that extends into the first insulation layer and is electrically coupled to the magnetic field sensor by an electrical interconnect.

20. The current sensor as claimed in claim 19, wherein the electrical connecting terminal and the portion of the current rail are separated and galvanically isolated by the first insulation layer.

* * * * *